US010157794B1

(12) United States Patent
Suvarna et al.

(10) Patent No.: US 10,157,794 B1
(45) Date of Patent: Dec. 18, 2018

(54) INTEGRATED CIRCUIT STRUCTURE WITH STEPPED EPITAXIAL REGION

(71) Applicant: GLOBALFOUNDRIES Inc., Grand Cayman (KY)

(72) Inventors: Puneet H. Suvarna, Menands, NY (US); Steven Bentley, Menands, NY (US); Mark V. Raymond, Latham, NY (US); Peter M. Zeitzoff, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/626,321

(22) Filed: Jun. 19, 2017

(51) Int. Cl.
*H01L 21/8234* (2006.01)
*H01L 21/285* (2006.01)
*H01L 27/088* (2006.01)
*H01L 29/45* (2006.01)
*H01L 29/78* (2006.01)
*H01L 29/08* (2006.01)
*H01L 29/423* (2006.01)

(52) U.S. Cl.
CPC ........ *H01L 21/823418* (2013.01); *H01L 21/28518* (2013.01); *H01L 21/823437* (2013.01); *H01L 21/823487* (2013.01); *H01L 27/088* (2013.01); *H01L 29/0847* (2013.01); *H01L 29/42392* (2013.01); *H01L 29/45* (2013.01); *H01L 29/7827* (2013.01); *H01L 29/7853* (2013.01); *H01L 2029/7858* (2013.01)

(58) Field of Classification Search
CPC .......... H01L 29/7827; H01L 29/42392; H01L 29/7853; H01L 2029/7858; H01L 21/823418
See application file for complete search history.

(56) References Cited

U.S. PATENT DOCUMENTS

| 5,231,037 | A | 7/1993 | Yuan et al. |
| 9,318,608 | B1 * | 4/2016 | Harley ................ H01L 21/3065 |
| 9,627,511 | B1 | 4/2017 | Cheng et al. |
| 9,647,112 | B1 * | 5/2017 | Balakrishnan ...... H01L 29/7845 |
| 9,825,032 | B1 * | 11/2017 | Bentley ............. H01L 29/41791 |
| 9,935,102 | B1 * | 4/2018 | Bi ........................ H01L 27/0886 |
| 9,954,102 | B1 * | 4/2018 | Mochizuki .......... H01L 29/6653 |
| 9,960,272 | B1 * | 5/2018 | Bao ..................... H01L 29/7827 |
| 10,008,417 | B1 * | 6/2018 | Bao ................. H01L 21/823487 |

(Continued)

*Primary Examiner* — Victoria K Hall
(74) *Attorney, Agent, or Firm* — David Cain; Hoffman Warnick LLC

(57) ABSTRACT

Embodiments of the disclosure provide integrated circuit (IC) structures with stepped epitaxial regions and methods of forming the same. A method according to the disclosure can include: removing a portion of a substrate to form a recess therein, the portion of the substrate being laterally adjacent to a semiconductor fin having a sidewall spacer thereon, to expose an underlying sidewall of the semiconductor fin; forming an epitaxial layer within the recess, such that the epitaxial layer laterally abuts the sidewall of the semiconductor fin below the sidewall spacer; removing a portion of the epitaxial layer to form a stepped epitaxial region adjacent to the semiconductor fin, the stepped epitaxial region including a first region laterally abutting the sidewall of the semiconductor fin, and a second region laterally adjacent to the first region; and forming a gate structure over the stepped epitaxial region and adjacent to the semiconductor fin.

14 Claims, 9 Drawing Sheets

(56) References Cited

U.S. PATENT DOCUMENTS

| | | | |
|---|---|---|---|
| 10,014,296 B1 * | 7/2018 | Dou | H01L 27/0886 |
| 10,014,370 B1 * | 7/2018 | Xie | H01L 29/0653 |
| 2007/0298654 A1 | 12/2007 | Holliday | |
| 2008/0069286 A1 | 3/2008 | Staszewski et al. | |
| 2015/0187654 A1 * | 7/2015 | Tegen | H01L 21/823412 |
| | | | 257/337 |
| 2015/0318213 A1 * | 11/2015 | Tsai | H01L 29/42376 |
| | | | 257/9 |
| 2015/0318288 A1 * | 11/2015 | Lim | H01L 27/1104 |
| | | | 257/329 |
| 2015/0371892 A1 * | 12/2015 | Xie | H01L 21/76224 |
| | | | 257/401 |
| 2016/0042783 A1 * | 2/2016 | Masuoka | H01L 27/092 |
| | | | 365/154 |
| 2016/0218105 A1 * | 7/2016 | Lee | H01L 29/7856 |

\* cited by examiner

US 10,157,794 B1

INTEGRATED CIRCUIT STRUCTURE WITH STEPPED EPITAXIAL REGION

BACKGROUND

Technical Field

The present disclosure relates to an integrated circuit (IC) structure, and more particularly, to IC structures including a stepped epitaxial region and methods of forming the same.

Related Art

Advanced manufacturing of ICs requires formation of individual circuit elements, e.g., transistors such as field-effect-transistors (FETs), and the like based on specific circuit designs. A FET generally includes source, drain, and gate terminals. The gate terminal is placed between the source and drain terminals and controls the current between the source and drain terminals. Transistors may be formed over a substrate and may be electrically isolated with an insulating dielectric layer, e.g., inter-level dielectric layer. Contacts may be formed to each of the source, drain, and gate terminals through the dielectric layer in order to provide electrical connection between the transistors and other circuit elements that may be formed subsequent to the transistor in other metal levels.

Conventionally, FETs are horizontal transistors wherein the source and drain terminals are adjacent to one other on or within the substrate, and the gate terminal is disposed laterally between the source and drain terminals over the substrate. However, vertical transistors have recently become of interest in the field. Vertical transistors differ from conventional FETs in that one of the source and/or drain terminals is located above the other source and/or drain terminal(s) with the gate terminal positioned vertically therebetween.

SUMMARY

A first aspect of the disclosure provides a method of forming an integrated circuit (IC) structure, the method including: removing a portion of a substrate to form a recess therein, the portion of the substrate being laterally adjacent to a semiconductor fin having a sidewall spacer thereon, wherein the removing undercuts the sidewall spacer to expose an underlying sidewall of the semiconductor fin; forming an epitaxial layer within the recess, such that the epitaxial layer laterally abuts the sidewall of the semiconductor fin below the sidewall spacer; removing a portion of the epitaxial layer to form a stepped epitaxial region adjacent to the semiconductor fin, the stepped epitaxial region including a first region laterally abutting the sidewall of the semiconductor fin, and a second region laterally adjacent to the first region, wherein a height of the first region over the substrate is greater than a height of the second region over the substrate; and forming a gate structure over the stepped epitaxial region and adjacent to the semiconductor fin.

A second aspect of the disclosure provides a method of forming an integrated circuit (IC) structure, the method including: removing a portion of a substrate to form a recess therein, the portion of the substrate being laterally adjacent to a semiconductor fin having a sidewall spacer thereon, wherein the removing undercuts the sidewall spacer to expose an underlying sidewall of the semiconductor fin; forming an epitaxial layer within the recess, such that the epitaxial layer laterally abuts the sidewall of the semiconductor fin below the sidewall spacer; removing the sidewall spacer from the semiconductor fin; forming a first insulative liner on the semiconductor fin and over the epitaxial layer; removing a portion of the epitaxial layer to form a first region of the epitaxial layer laterally abutting the sidewall of the semiconductor fin, and a second region of the epitaxial layer laterally adjacent to the first region, wherein a height of the first region over the substrate is greater than a height of the second region over the substrate; forming a second insulative liner on the semiconductor fin to overlie a portion of the second region of the epitaxial layer; removing an additional portion of the epitaxial layer to form a third region of the epitaxial layer laterally adjacent to the second region, wherein a height of the third region over the substrate is less than the height of the second region over the substrate, and wherein the first, second, and third regions define a stepped epitaxial region; removing the first and second insulative liners; and forming a gate structure over the stepped epitaxial region and adjacent to the semiconductor fin.

A third aspect of the disclosure provides a vertical transistor structure, comprising: a semiconductor fin positioned on a substrate; a first source/drain region positioned on the substrate and laterally abutting a sidewall of the semiconductor fin, the first source/drain region including a first region laterally abutting the sidewall of the semiconductor fin, and a second region laterally adjacent to the first region, wherein a height of the first region over the substrate is greater than a height of the second region over the substrate; a gate structure positioned over the first source/drain region and laterally abutting the sidewall of the semiconductor fin; and a second source/drain region positioned on an upper surface of the semiconductor fin.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to an integrated circuit (IC) structure, and more particularly, to vertical transistors with stepped source/drain regions and methods of forming the same. Specifically, the present disclosure provides for integrating stepped epitaxial regions into the source/drain terminals thereof. Among other things, a stepped epitaxial region can reduce the amount of parasitic capacitance and resistance across the transistor during operation of a device. Embodiments of the disclosure also provide for various processing techniques to yield IC structures with a stepped epitaxial region included therein. The various embodiments described herein may be implemented in a vertical transistor, also known as a vertical field effect transistor or "VFET." Vertical transistors may be distinguished from other transistor configurations, e.g., MOSFET, FINFET, tunnel FET, and/or other types of transistors by including a set of vertically stacked terminals. For instance, a vertical transistor may include a source terminal positioned vertically beneath a gate terminal to the transistor, with an insulator vertically separating the gate from the source. Similarly, a drain terminal of the transistor can be positioned above and vertically separated from the gate terminal, e.g., with another insulating material. Contacts to the source, drain, and/or gate terminals of a vertical transistor can be positioned laterally adjacent to the device in a shared dielectric layer in a spaced arrangement. Such vertical transistor structures are a contrast to other devices, e.g., where contacts to the various terminals only extend vertically to the transistor through overlying layers.

Figure 1:
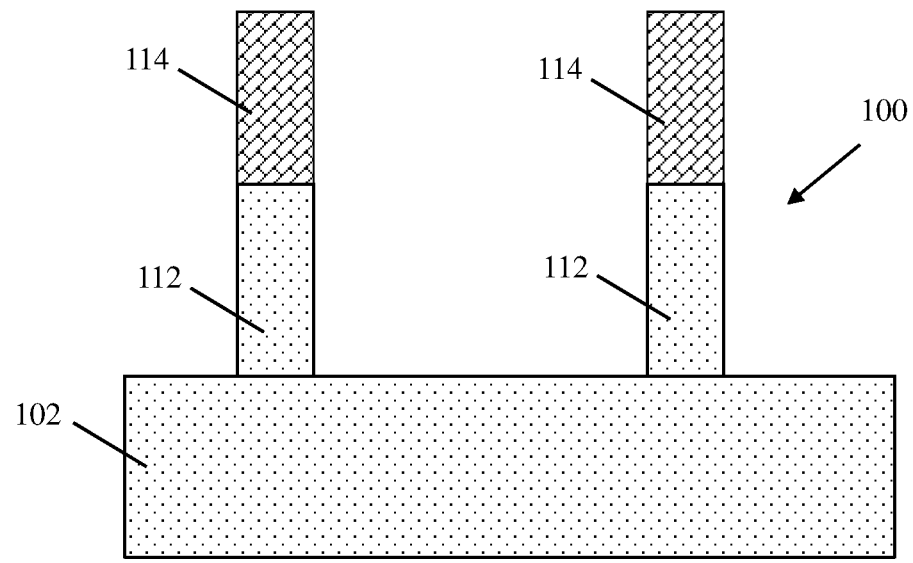
FIG. 1 provides a cross-sectional view of a substrate and pair of semiconductor fins to be processed according to the present disclosure.

FIGS. 1-17 show a cross-sectional view of a structure being processed according to embodiments of the disclosure. Referring initially to FIG. 1, a precursor structure 100 is shown. Precursor structure 100 may include a substrate 102. As shown, substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 of precursor structure 100 may be formed by forming a semiconductor material on an underlying structure. According to an example, substrate 102 can be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Still referring to FIG. 1, one or more fins 112 may be formed from substrate 102. Each fin 112 may be formed by forming a mask 114 over various portions of a semiconductor layer, and patterning and etching mask 114 such that a portion of mask 114 remains intact where fin(s) 112 are desired. Subsequently, the original semiconductor material may be etched such that the portion of substrate 102 that is covered or protected by mask 114 forms fin 112. Mask 114 may include silicon dioxide and/or silicon nitride, or any other hard mask material known in the art. Mask 114 can be subdivided into multiple layers of material. According to an example, mask 114 can include multiple layers of distinct masking materials, e.g., a deposited layer of silicon dioxide, with a layer of silicon nitride thereon, and a capping layer of silicon dioxide positioned on the silicon nitride layer. While two fins 112, are shown, it is understood that any number of fins 112 (e.g., one fin, five fins, one hundred fins, one thousand or more fins, etc.) may be formed on substrate 102 without departing from aspects of the disclosure. The embodiments described herein are thus operable for processing one fin 112 and/or multiple fins 112. It is also understood that fins 112 can be formed on substrate 102 by way of other techniques, some of which may include different masks 114 and/or may not include masks 114. Such methods can include, e.g., patterning a mandrel and thereafter forming fins 112 by epitaxial definition on substrate 102.

Figure 2:
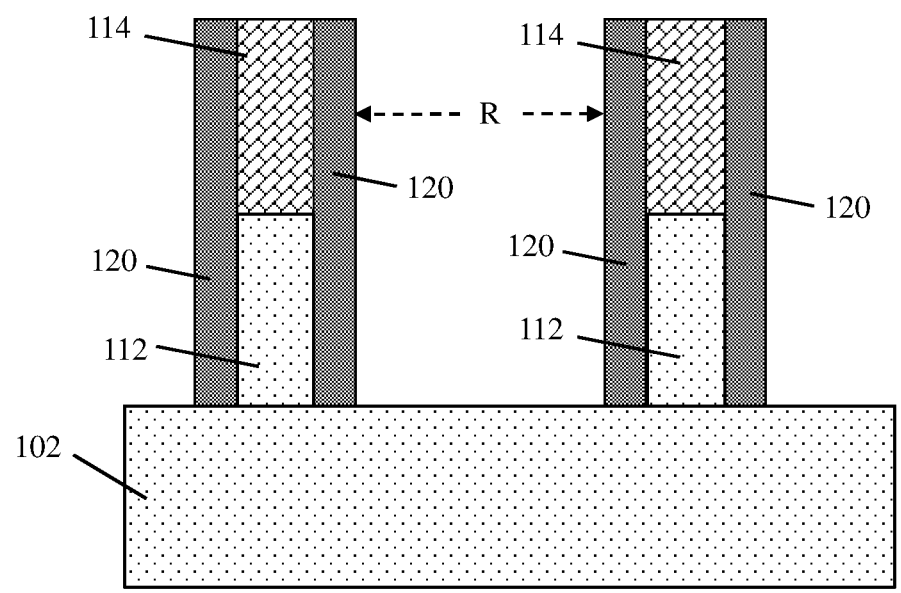
FIG. 2 provides a cross-sectional view of forming sidewall spacers on semiconductor fins according to the present disclosure.

Referring now to FIG. 2, spacers 120 may be formed, e.g., by a combination of deposition and etching, over substrate 102 and laterally adjacent to fin 112. Spacers 120 may include any conventional spacer material, such as, for example, an oxide. As shown in FIG. 2, spacers 120 may overlie a portion of substrate 102, and can laterally abut vertical portions of respective fins 112. Where multiple fins 112 are positioned on substrate 102, an intermediate region R can include an exposed upper surface of substrate 102 to be processed as described herein.

Figure 3:
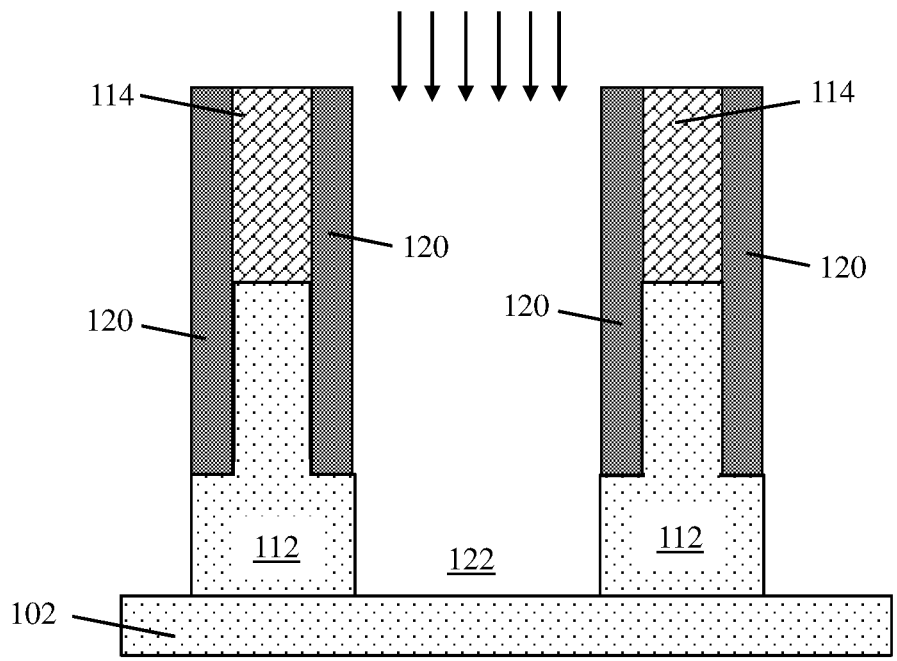
FIG. 3 provides a cross-sectional view of forming a recess within a substrate adjacent to semiconductor fins according to the present disclosure.

Turning to FIG. 3, embodiments of the disclosure can include removing a portion of substrate 102 to form a recess 122 therein. Portions of substrate 102 can be removed to form recess 122 by any currently-known or later developed process for removing targeted portions of semiconductor material. At least part of substrate 102 can remain intact, e.g., beneath or laterally adjacent to the removed portions of substrate 102. The lateral width of recess 122 can be determined based on a separation between fins 112, and thus can be substantially equal to the size of intermediate region R (FIG. 2). Forming recess 122 can initially cause each fin 112 to have a non-uniform lateral thickness above substrate 102. Spacers 120 can remain substantially intact on each fin 112 because of substrate 102 being selectively etched or otherwise targeted for removal by application of one or more selective removal techniques described herein. Etching is one example of a process to form recess 122 from substrate 102.

Etching generally refers to the removal of material from a substrate (or structures formed on the substrate), and is often performed with a mask in place so that material may selectively be removed from certain areas of the substrate, while leaving the material unaffected in other areas of the substrate. An etching process is depicted symbolically in FIG. 3 with downward-oriented arrows. There are generally two categories of etching, (i) wet etch, and (ii) dry etch. Wet etch is performed with a solvent (such as an acid or a base) which may be chosen for its ability to selectively dissolve a given material (such as oxide), while leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotopic. Reactive-ion etching (RIE) operates under conditions intermediate between sputter and plasma etching and may be used to produce deep, narrow features, such as STI trenches. Recess 122 can be formed by way of an isotropic etch, such that the depth of recess 122 is substantially uniform in size.

Figure 4:
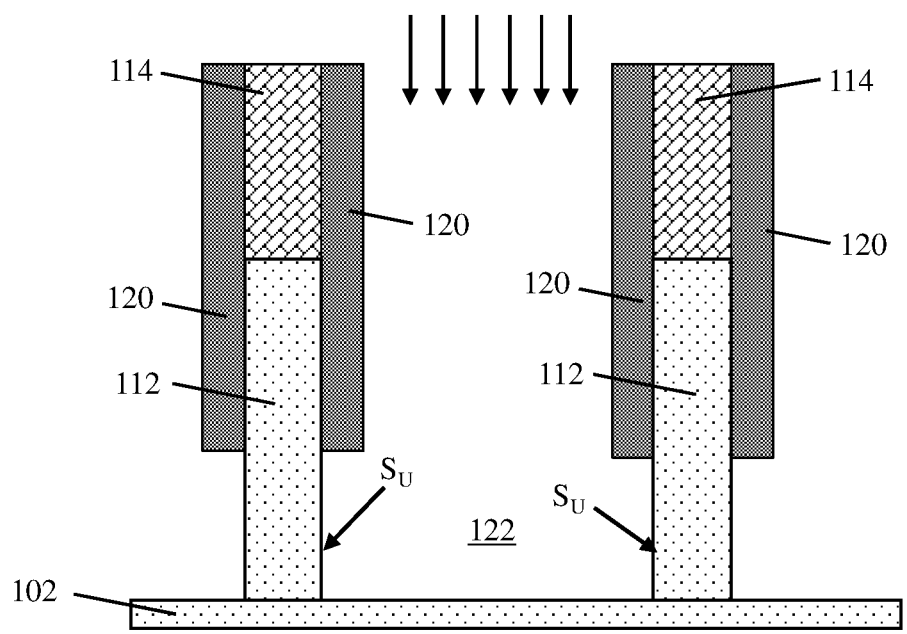
FIG. 4 provides a cross-sectional view of forming a lateral recess beneath sidewall spacers and adjacent to semiconductor fins according to the present disclosure.

Turning to FIG. 4, portions of semiconductor material in fins 112 can also be removed to laterally undercut spacers 120 on each fin 112. FIG. 4 depicts an etching process being applied to fin(s) 112 and/or substrate 102 with downward-oriented arrows. The amount of etchant and/or the total etching time can be controlled such that fins 112 exhibit a substantially uniform thickness after being etched. Spacers 120 can remain in position on vertical surfaces of each fin 112, overlying substrate 102 thereunder. Removing additional portions of substrate 102, as shown in FIG. 4, can expose sidewalls $S_U$ of fins 112 positioned between each spacer 120 and an upper surface of substrate 102. The resulting shape and size of recess 122 can thus be appropriate to form stepped epitaxial regions for vertical transistors as described elsewhere herein. In the case of an isotropic etch, portions of substrate 102 can also be removed as fins 112 are processed to expose sidewalls $S_U$ thereof.

Figure 5:
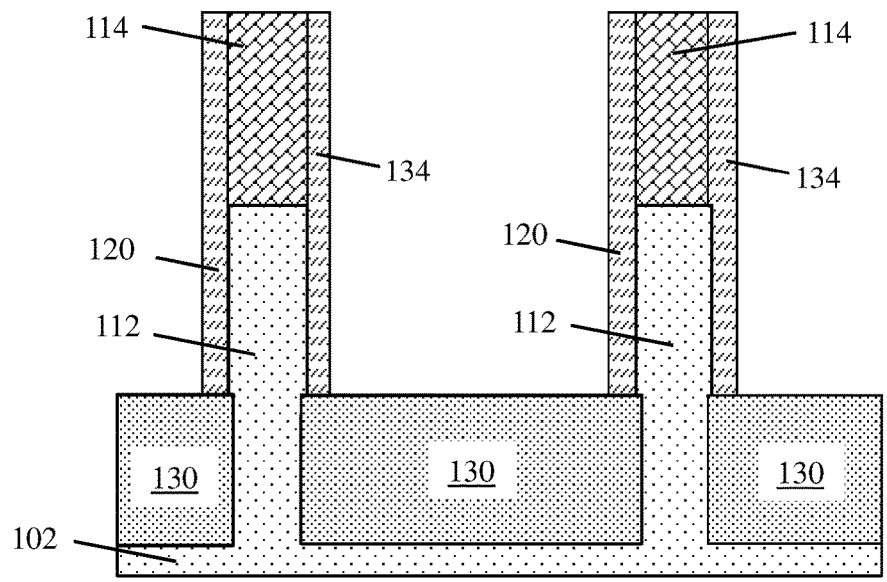
FIG. 5 provides a cross-sectional view of forming an initial epitaxial region adjacent to semiconductor fins according to the present disclosure.

Turning to FIG. 5, an epitaxial layer 130 suitable for use as a source/drain region of a transistor may be formed over substrate 102, and laterally adjacent to fin(s) 112, to substantially fill recess(es) 122 formed by earlier processing of substrate 102. Epitaxial layer 130 may include, for example, silicon, silicon germanium, or silicon carbon and may be doped with conventional n-type or p-type dopants. Epitaxial layer 130 may be formed such that epitaxial layer 130 completely fills recess 122 (FIGS. 3-4) and abuts fin 112 in an area over substrate 102 and beneath spacer(s) 120. Epitaxial layer 130 may be grown below spacer 120 from a portion of fin 112 below spacer 120, and on an upper surface of substrate 102. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces. In still further embodiments, an operator can change the properties and/or composition of epitaxial layer 130 by forming a layer of dopants (not shown) thereon, and then annealing the layer of dopants. Such annealing can cause dopants to diffuse into epitaxial layer 130 to change its conductivity and/or other properties, e.g., to provide higher electrical conductivity through epitaxial layer 130 during operation.

In addition to forming epitaxial layer 130, embodiments of the disclosure can include removing spacers 120 (FIGS. 2-4) from fin(s) 112 and mask(s) 114 to form other structures for protecting underlying materials from being processed in subsequent steps. Spacers 120 can optionally be removed from fin 112 and mask 114 subsequent to forming epitaxial layer 130 and before additional processes described herein. Methods according to the disclosure can include stripping spacer(s) 120, e.g., by one or more currently-known or later developed processes of removing a material from an integrated circuit structure without patterning the underlying materials. After spacers 120 are removed, embodiments of the disclosure can include forming an insulative liner 134 on semiconductor fin 112 and over epitaxial layer 130.

Insulative liner 134 can be formed, e.g., as a conformal layer of insulative material by any currently-known or later developed process for selectively depositing an insulative material on a structure. Portions of insulative liner 134, initially, may also be positioned on epitaxial layer 130 before being removed when stepped epitaxial layer is recessed in subsequent processing of the structure. Insulative liner 134 may be composed of any insulating material such as $SiO_2$ or a "high-k" dielectric having a high dielectric constant, which may be, for example, above 3.9. In some situations, insulative liner 134 may be composed of an oxide, nitride, and/or other insulating material. Materials appropriate for the composition of dielectric layer 118 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties. Insulative liner 134 can protect fins 112 and mask 114 from being affected by further processing, e.g., portions of epitaxial layer 130 being removed. In some cases, spacers 120 and mask 114 may be sufficient to protect fins 112 from being affected by other processes, and it is thus understood that spacers 120 may be remain intact on fins 112 in alternative embodiments. Where applicable, spacer 120 may be substituted for insulator liner 134 in other processes described herein.

Figure 6:
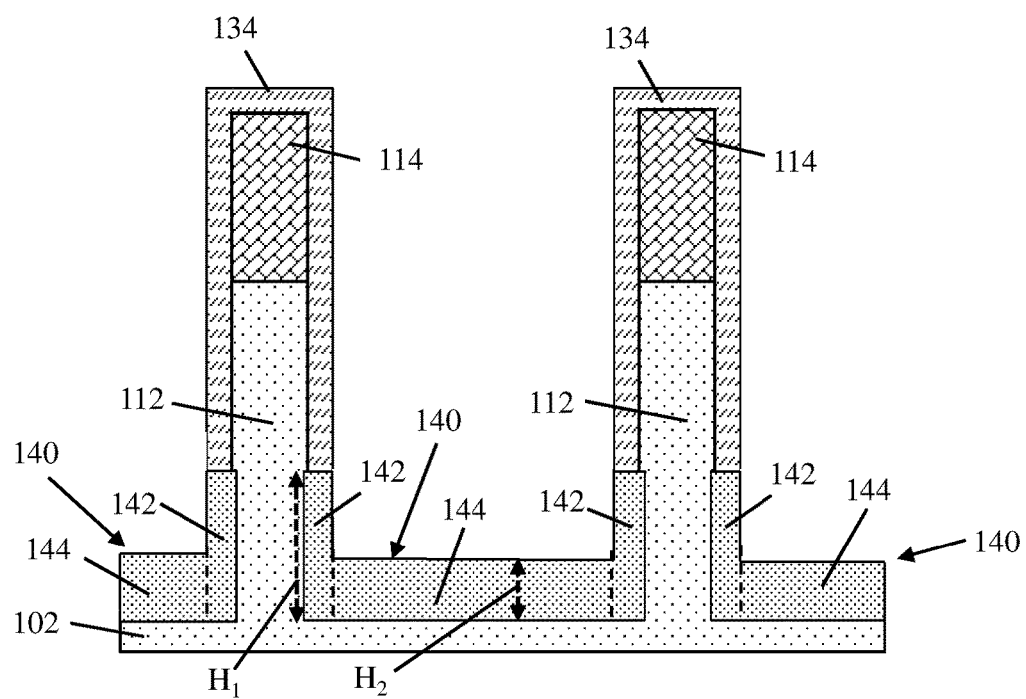
FIG. 6 provides a cross-sectional view of forming a stepped epitaxial region from the initial epitaxial region according to the present disclosure.

Turning to FIG. 6, portions of epitaxial layer 130, and any portions of insulator 134 formed thereon, can be removed to yield a stepped epitaxial region 140 on substrate 102 and adjacent to fin(s) 112. To form stepped epitaxial region 140 from epitaxial layer 130, a targeted portion of epitaxial layer 130 (e.g., portions of epitaxial layer 130 not covered by insulative liner 134) can be selectively removed without exposing the upper surface of substrate 102 thereunder. Portions of epitaxial layer 130 can be removed to form stepped epitaxial region 140, e.g., by any currently-known or later developed process for removing an epitaxially formed semiconductor material, e.g., etching and/or other processes described herein. For example, a temporary mask can be formed on insulator liner 134 and above fin(s) 112, leaving epitaxial layer 130 and/or other portions of insulator liner 134 susceptible to etching. Stepped epitaxial region 140 can exhibit a "stepped" structure by including multiple regions having distinct thicknesses relative to substrate 102. Stepped epitaxial region 140 can include, e.g., a first region 142 laterally abutting fin 112 and positioned, e.g., directly below insulative liner 134 on fin 112. Stepped epitaxial region 140 can also include a second region 144 laterally adjacent to first region 142 such that first region 142 is interposed directly between fin 112 and second region 144. In this configuration, second region 144 can represent a remaining portion of epitaxial layer 130 positioned beneath previously removed material. First region 142 can be composed of epitaxial material substantially protected from the earlier removal processes, although portions of first region 142 may have been laterally etched. As shown, height $H_1$ of first region 142 above substrate 102 can be greater than height $H_2$ of second region 144 above substrate 102. The different heights $H_1$, $H_2$ of each region 142, 144 of stepped epitaxial region 140 can reduce the parasitic capacitance, resistance, etc., of a vertical transistor fabricated to include stepped epitaxial region 140, e.g., by providing an increased contact area with electrically connected elements as noted elsewhere herein.

Figure 7:
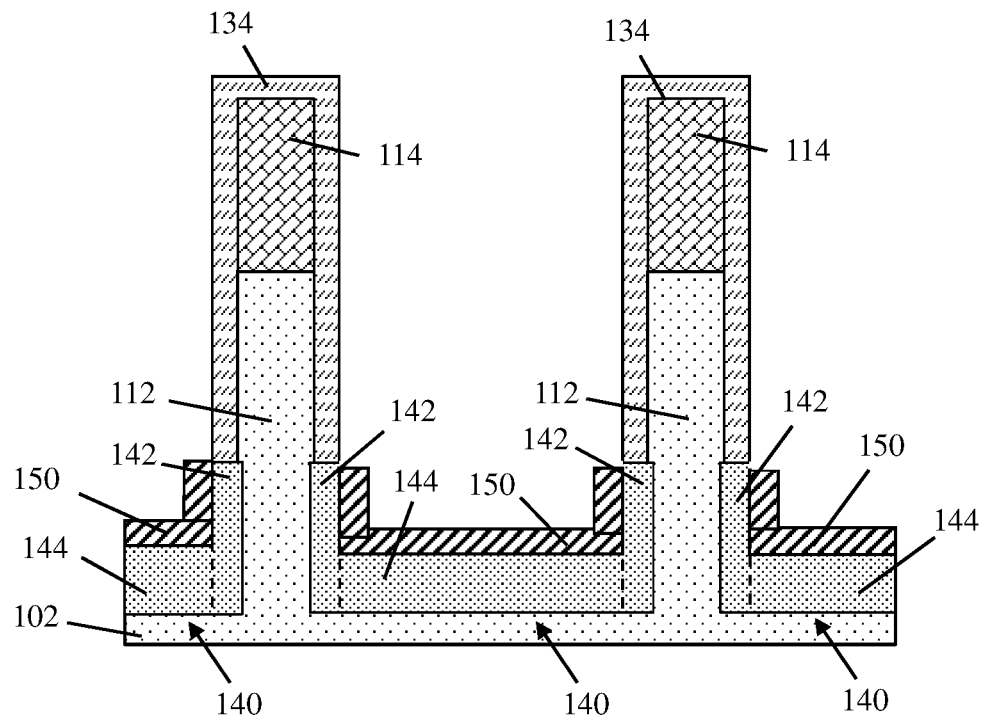
FIG. 7 provides a cross-sectional view of forming a silicide region on the stepped epitaxial region according to embodiments of the disclosure.

Turning to FIG. 7, embodiments of the disclosure can include reacting first and second regions 142, 144 of stepped epitaxial region 140 with a conductive material to form a silicide region 150 located on at least a vertical sidewall of first region(s) 142 and an upper surface of second region(s) 144. Silicide generally refers to one or more alloys of silicon and metal produced to form a conductive contact to a semiconductor material. Example silicide compounds can include, e.g., titanium silicide ($TiSi_2$), cobalt silicide ($CoSi_2$), nickel silicide (NiSi), and/or other compounds or alloys which include a semiconductor material (e.g., silicon) and one or more conductive metals. Silicide region(s) 150 can be formed on stepped epitaxial region(s) 140 by depositing a layer of conductive metal and then annealing the metal such that at least some of the original metal diffuses into the underlying semiconductor material, yielding silicide region(s) 150. Any remaining metal positioned over silicide region(s) 150 can then be selectively removed. Silicide region(s) 150 can improve the conductivity and electrical performance of transistor structures, e.g., vertical transistors, formed to include stepped epitaxial region(s) 140 therein.

Figure 8:
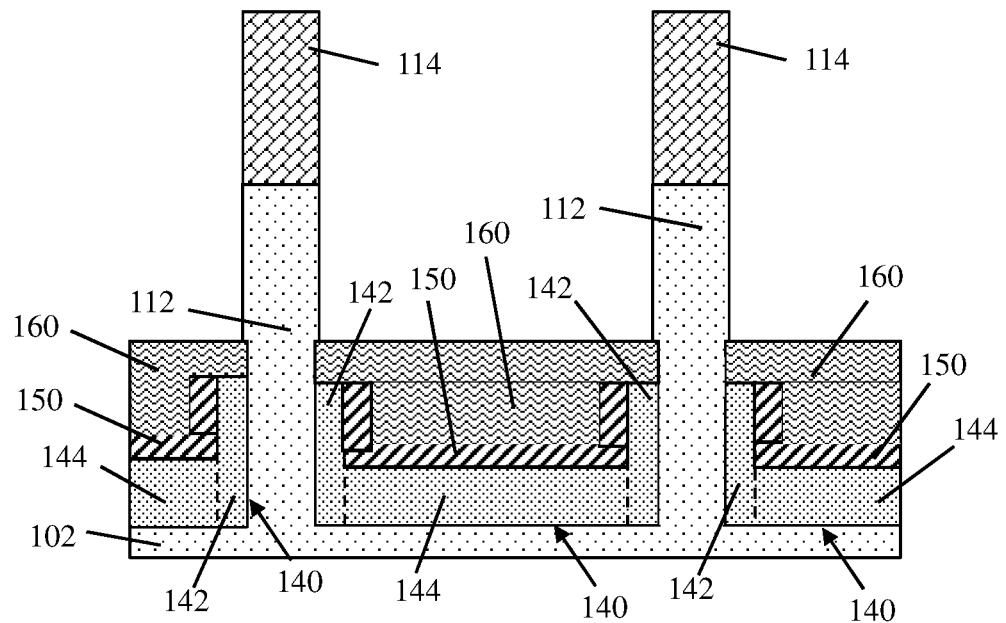
FIG. 8 provides a cross-sectional view of forming a spacer for a gate structure according to embodiments of the disclosure.

Referring now to FIG. 8, embodiments of the disclosure can include forming additional structures over stepped epitaxial region 140 and, in some cases, silicide region 150, to yield components of a transistor structure. Initially, insulator liner 134 (or gate 120 (FIGS. 2-4), where applicable) can be removed to expose fin(s) 112 and mask(s) 114 after stepped epitaxial region 140 is formed. Methods of forming an IC structure according to the disclosure can include forming one or more spacers 160, alternatively known as "gate spacers," over stepped epitaxial region 140. Spacers 160 can be formed, e.g., by deposition and etching. Spacers 160 may thus may be formed from a layer of bulk insulative material deposited over stepped epitaxial region 140 and, optionally, silicide 150, to a desired thickness or height. The bulk material can then be etched such that a portion of the original spacer material remains laterally adjacent to and in contact with fin 112. Spacer(s) 160 may substantially surround fin 112 and extend along a substantial portion of the vertical length (into the page) of fin 112, thereby causing spacer(s) 160 to laterally abut respective fin(s) 112. Spacer(s) 160 may include, for example, any material conventionally used for a layer of insulating material for vertically separating two layers such as, e.g., silicon nitride, silicon oxide, fluorinated silicon dioxide (FSG), hydrogenated silicon oxycarbide, porous silicon oxycarbide, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 9:
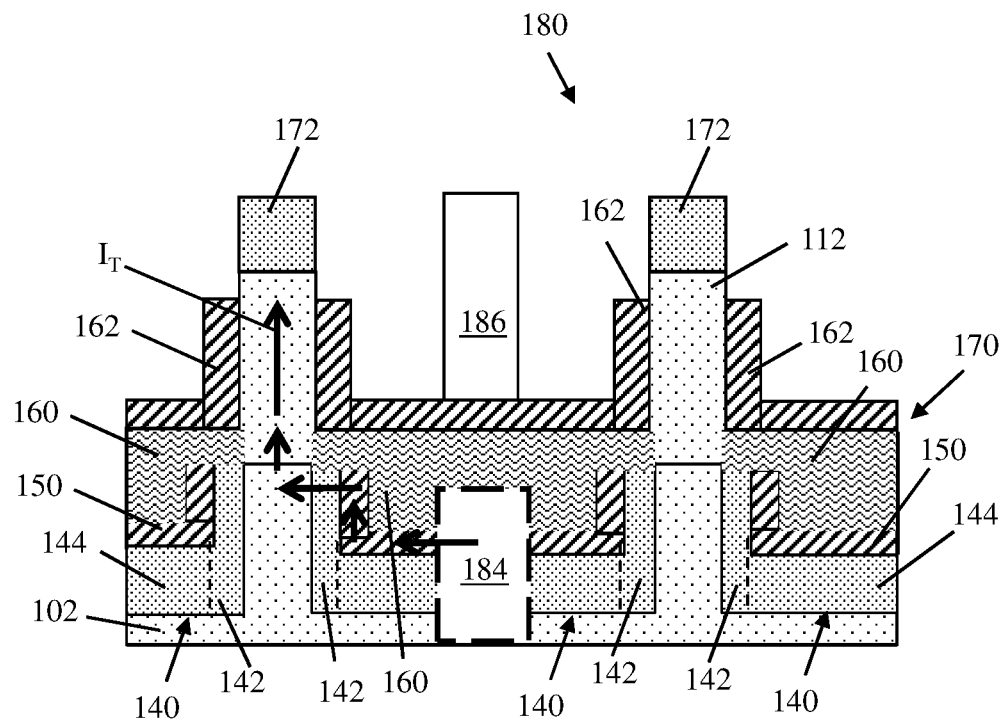
FIG. 9 provides a cross-sectional view of forming a gate structure for a vertical transistor according to embodiments of the disclosure.

Turning to FIG. 9, methods according to the disclosure can include forming a gate region 162 on spacer 160 and in contact with exposed vertical surfaces of fin(s) 112. Gate region 162 can include any type of conducting material (e.g., metal, polycrystalline silicon, etc.) for providing an electrical junction to fin 112 to define a gate terminal of a transistor structure. Gate region 162 can also include, e.g., a thin and electrically insulating gate dielectric region to separate gate region 162 from fin 112. The various components of gate region 162 can be formed by way of deposition and/or other currently-known or later developed procedure of forming conducting materials, etc. However formed, gate region 162 can directly laterally abut fin 112 to provide an electrical pathway between gate region 162 and fin 112. The position of spacer 160 between gate region 162 and stepped epitaxial region 140 and silicide region 150 can provide electrical separation between stepped epitaxial region 140 and gate region 162 during operation of a device. Together, spacer 160 and gate region 162 can define a gate structure 170 positioned over stepped epitaxial region 140 and laterally adjacent to fin(s) 112.

Further processes according to the disclosure can include forming source/drain regions 172 on fin(s) 112. As described elsewhere herein, mask(s) 114 can be removed from fin(s) 112 after gate structure 170 is formed, e.g., by any process for removing a masking material. Such processes may include, e.g., ashing in addition to one or more removal processes discussed herein. Ashing generally refers to the selective removal of insulating and/or organic elements by volatilization, e.g., by using one or more strongly oxidizing ambient materials or techniques (e.g., oxygen plasma ashing). Source/drain region 172 can thereafter be formed on fin(s) 112, e.g., by deposition, ion implantation, and/or selective epitaxial growth on fins 112. Source/drain regions 172 can include any semiconductor material appropriate for operation as a source/drain material in a transistor, and according to an example can include one or more of the materials included in stepped epitaxial region 140 and/or a different material.

The various processes discussed herein can yield a vertical transistor structure 180 with stepped epitaxial region 140 positioned on substrate 102. Stepped epitaxial region 140 can define a first source/drain region to fin 112. Where two or more fins 112 are positioned on substrate 102, the forming of stepped epitaxial region 140 between two fins 112 can cause stepped epitaxial region 140 to be substantially U-shaped, e.g., by including two first regions 142 and a single second region 144 directly between each first region 142. Transistor structure 180 can also include gate structure 170 laterally adjacent to and in contact with fin 112 over stepped epitaxial region 140. As noted elsewhere herein, sub-components of gate structure 170 can include spacer 160 positioned over stepped epitaxial region 140, and gate region 162 positioned on and in contact with spacer 160, with spacer 160 and gate region 162 each being laterally adjacent to fin 112.

Source/drain regions 172 of transistor structure 180 can define a second source/drain region to fin 112. Transistor structure 180 can also include silicide region(s) 150 in contact with stepped epitaxial region 140 as described elsewhere herein. To provide an electrical connection to other components of a device, transistor structure 180 can include a source/drain contact 184 to stepped epitaxial region 140, positioned, e.g., laterally adjacent to stepped epitaxial region 140 into or out of the plane of the page. Thus, source/drain contact 184 is shown with broken lines to depict an element positioned in a different cross-sectional plane from other components. Transistor structure 180 can also include, e.g., a gate conductor 186 positioned directly on or otherwise in contact with gate region 162 to provide an electrical pathway between gate structure 170 and other components electrically coupled to transistor structure 180. The parasitic capacitance of transistor structure 180 can depend at least partially on the amount of vertical separation between gate region 162 and stepped epitaxial region 140. The varying height of stepped epitaxial region 140, e.g., at second region 144, can thus reduce the total parasitic capacitance of transistor structure 180 during operation.

The processes described herein can yield second region 144 of stepped epitaxial region 140 with a greater separation distance from gate region 162, thereby reducing the total parasitic capacitance of transistor structure 180. In addition, the presence of first region 142 in stepped epitaxial region 140 can provide an increased contact area between fin 112 and stepped epitaxial region 140, providing a higher level of transistor current $I_T$ from source/drain contact 184 to the source drain region(s) 172 overlying fin(s) 112. The increased amount of current can thereby reflect a reduced parasitic resistance in transistor structure 180, relative to conventional devices, during operation. Subsequent formation of any additional insulators, metal wires, etc., on or adjacent to transistor structure 180 can proceed according to currently-known or later developed circuit fabrication schemes.

Figure 10:
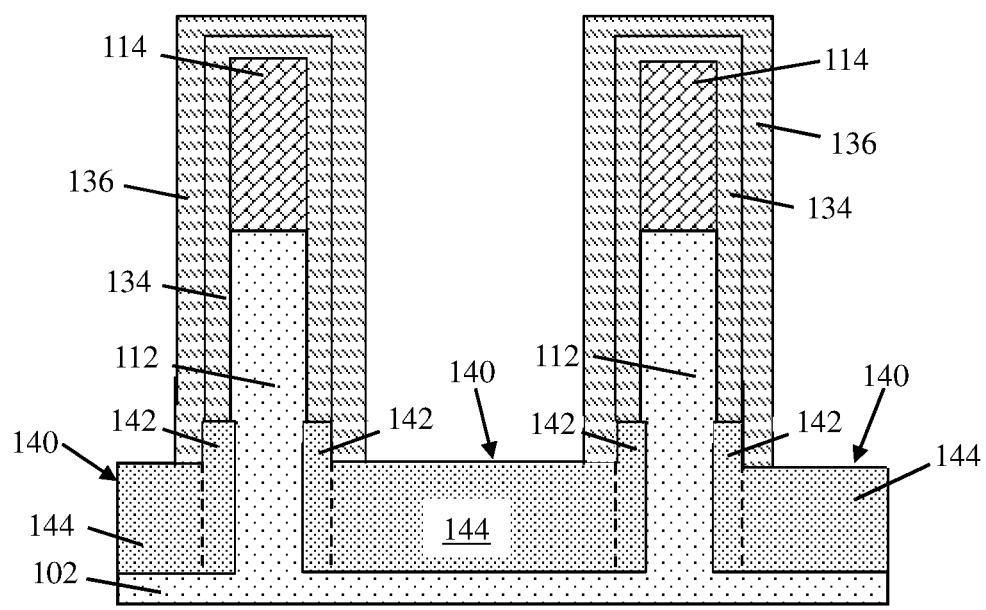
FIG. 10 provides a cross-sectional view of forming a second insulative liner according to embodiments of the disclosure.

Referring to FIGS. 5 and 10 together, embodiments of the disclosure can alternatively include further modifications to epitaxial layer 130 (FIG. 5 only) before forming other structures thereon. As shown in FIG. 10 and discussed elsewhere herein, a portion of epitaxial layer 130 not initially covered by insulative liner(s) 134 can be removed to yield first and second regions 142, 144 with respective heights above substrate 102. Thereafter, embodiments of the disclosure can include forming a second insulative liner 136, e.g., on first insulative liner 134, to overlie a portion of second region 144. Second insulative liner 136 can be formed in the same manner as first insulative liner 134, or may be formed by any other currently-known or later developed process appropriate to form a liner of electrically insulating material. Although second liner 136 is depicted by example as being formed directly on first insulative liner 134, it is understood that first insulative liner 134 can be removed before second insulative liner 136 is formed directly on fin 112 in alternative embodiments. In some cases, second insulative liner 136 can be formed by expanding first insulative liner 134, e.g., by depositing the same material thereon to increase the size of first insulative liner 134. In any case, a portion of second region 144 of stepped epitaxial region 140 may remain exposed after second insulative liner 136 is formed.

Figure 11:
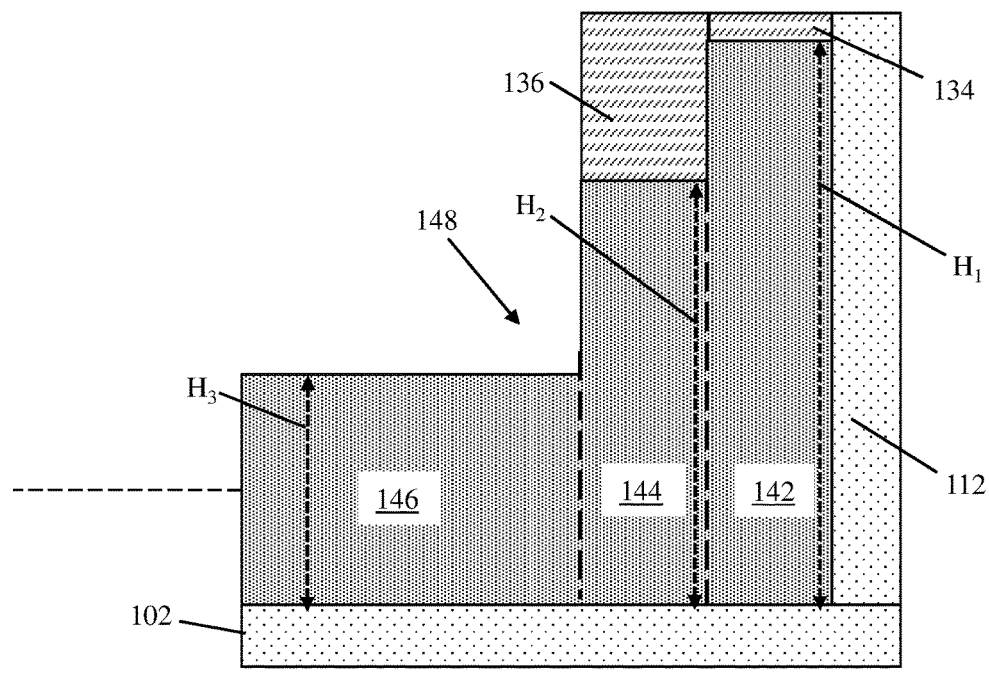
FIG. 11 provides a cross-sectional view of a stepped epitaxial region with three regions according to embodiments of the disclosure.

Turning to FIGS. 10 and 11, portions of stepped epitaxial region 140 not covered by insulative liners 134, 136 can be removed to form a third region 146. The resulting structure can provide a stepped epitaxial region 148 with three regions 142, 144, 146. Portions of stepped epitaxial region 140 can be removed to form third region 146, e.g., by any currently-known or later developed technique for removing semiconductor materials. One or more processes for creating first and second regions 142, 144 from epitaxial layer 140 (FIG. 5), e.g., etching, can be re-applied to form third region 146 and stepped epitaxial region 148. Each region 142, 144, 146 of stepped epitaxial region 148 can be structured to exhibit a respective height above substrate 102. As noted elsewhere herein, second region 144 can have a height $H_2$ above substrate 102 that is less than height $H_1$ of first region 142 above substrate 102. Third region 146, upon being formed, can exhibit a height $H_3$ that is less than height $H_1$, $H_2$ of each other region 142, 144. As noted elsewhere herein, the reduced height of third region 146 relative to first and second regions 142, 144 can provide a greater separation distance between gate and source/drain terminals of a resulting transistor structure and thus further reductions to parasitic capacitance.

Figure 12:
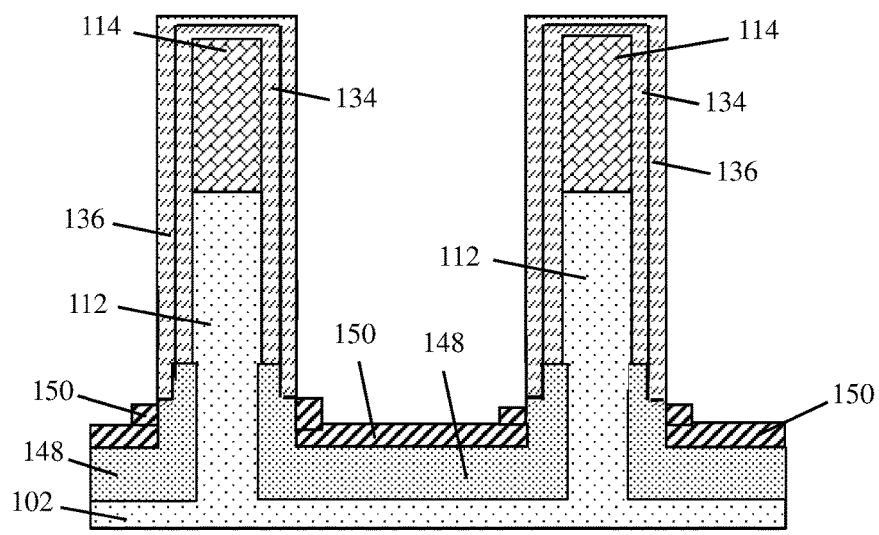
FIG. 12 provides a cross-sectional view of forming a recess and a silicide on a stepped epitaxial region according to embodiments of the disclosure.
Figure 13:
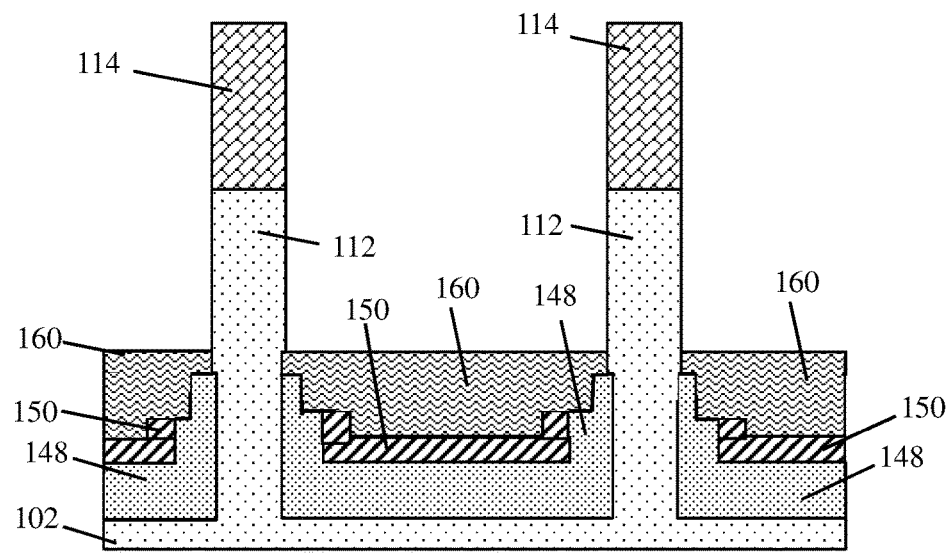
FIG. 13 provides a cross-sectional view of forming a spacer on a stepped epitaxial region according to embodiments of the disclosure.
Figure 14:
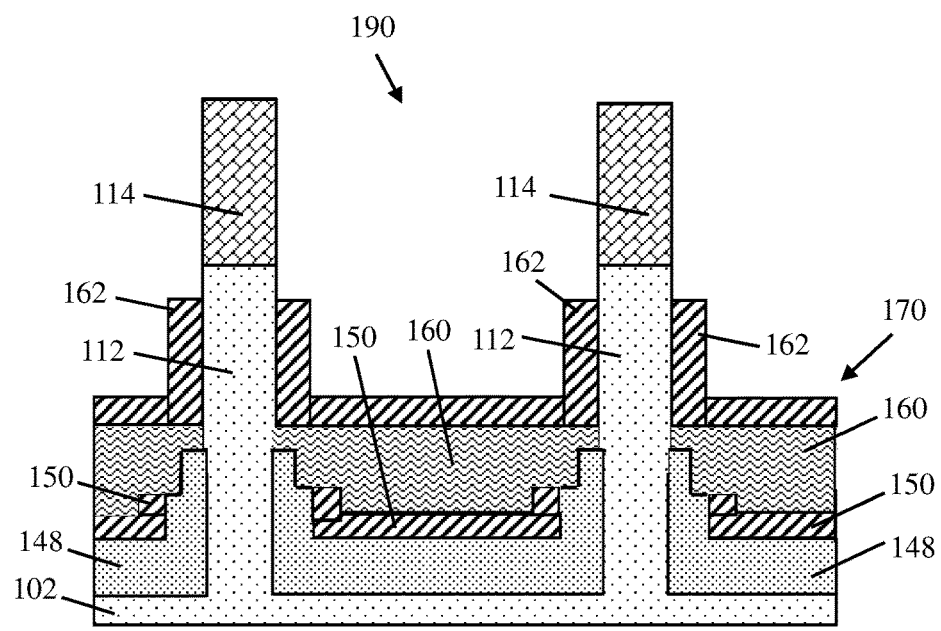
FIG. 14 provides a cross-sectional view of forming a gate structure on a spacer over a stepped epitaxial region according to embodiments of the disclosure.

Referring to FIGS. 12-14 together, subsequent processes according to the disclosure can proceed substantially as noted elsewhere herein relative to forming transistor structure 180 (FIG. 9). As shown in FIG. 12, silicide region 150 can be formed on an upper surface and vertical surfaces of stepped epitaxial region 148, e.g., along an upper surface of third region 146 (FIG. 11) and exposed vertical surfaces of second region(s) 144 (FIG. 11). Insulator liners 134, 136 are shown to remain intact during the forming of silicide region 150. Regions 142, 144, 146 (FIG. 11) of stepped epitaxial region 148 are not separately identified in FIGS. 12-14 solely for clarity of illustration. Silicide region 150 can provide increased electrical conductivity between stepped epitaxial region 148 and components electrically coupled thereto as noted elsewhere herein. Spacer 160 can then be formed over stepped epitaxial region 148 and, where applicable, on silicide region 150 as shown in FIG. 13. Spacer 160 can be formed at least partially on exposed portions of stepped epitaxial region 148 to yield further vertical separation between regions 148, 150, and other structures (e.g., gates) formed adjacent to fins 112.

FIG. 13 shows a process of forming gate structure 170 as described elsewhere herein. Before any part of gate structure 170 is formed, embodiments of the disclosure can include removing first and second insulative liners 134, 136 from fin(s) 112 to expose the underlying semiconductor composition of fins 112. Removing insulative liners 134, 136 can allow portions of gate structure 170 to be formed in lateral contact with fin(s) 112. After insulative liners 134, 136 have been removed, gate region 162 can be formed on spacer 160 as described elsewhere herein to yield a gate structure 170 positioned over stepped epitaxial region 148. An IC structure 190 formed according to the processes described herein can include stepped epitaxial region 148 with three regions 142, 144, 146 (FIG. 11) with corresponding heights $H_1$, $H_2$, $H_3$ (FIG. 11) over substrate 102. Where stepped epitaxial region 148 is formed between two fins, e.g., as shown in FIG. 14, stepped epitaxial region 148 can be substantially U-shaped. First regions 112 can each be positioned adjacent to respective fins 112, as shown in FIG. 11. In this case, third region 146 can be positioned, e.g., laterally between two first regions 112 to form a vertically bowed or otherwise substantially U-shaped structure. IC structure 190 can then be processed to yield a vertical transistor as described elsewhere herein.

Figure 15:
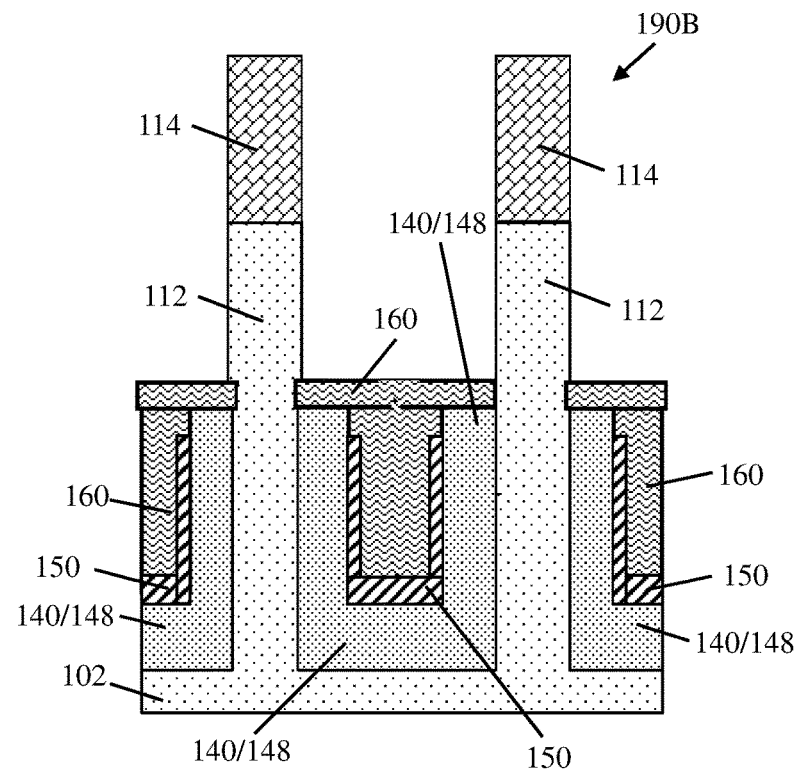
FIG. 15 provides a cross-sectional view of forming a narrow stepped epitaxial region and spacer according to embodiments of the disclosure.

Referring to FIG. 15, embodiments of the disclosure and can include processing variants to form an IC structure 190B with geometrical variations. In particular, embodiments of the disclosure can be effective to form vertical transistors for "narrow pitch" devices, i.e., a lateral separation of less than approximately twenty nanometers (nm) between adjacent fins 112, or in other cases less than approximately ten nm, five nm, etc. IC structure 190B for narrow pitch devices can be formed according to the various processes described elsewhere herein relative to FIGS. 1-14, and with one or more of the processing variants described herein where applicable. In a narrow pitch device, the eventual gate formed on IC structure 190B may be formed from a different material relative to other devices, e.g., titanium-aluminum carbide (TiAlC), titanium carbide (TiC) doped with aluminum (Al), etc.

To form IC structure 190B, the vertical depth between substrate 102 and upper surfaces of each fin 112 can be significantly increased relative to other devices. To account for this change in geometrical configuration, embodiments of the disclosure can include growing a larger-volume stepped epitaxial region 140, 148 laterally between fins 112, such that a remaining lateral gap between vertical portions of stepped epitaxial region 140, 148 is approximately, e.g., half of the lateral separation distance between fins 112. After stepped epitaxial region 140, 148 is formed, silicide region 150 and spacer 160 can be formed thereon as described elsewhere herein. In some cases, silicide region 150 may be not be formed on some portions of stepped epitaxial region 140, 148, e.g., due to the differences in size and vertical-lateral aspect ratio of each stepped epitaxial region 140, 148. Despite underlying geometrical differences of IC structure 190B relative to other structures described herein, IC structure 190B can nonetheless be processed to form vertical transistors according to one or more of the further processes described herein.

Figure 16:
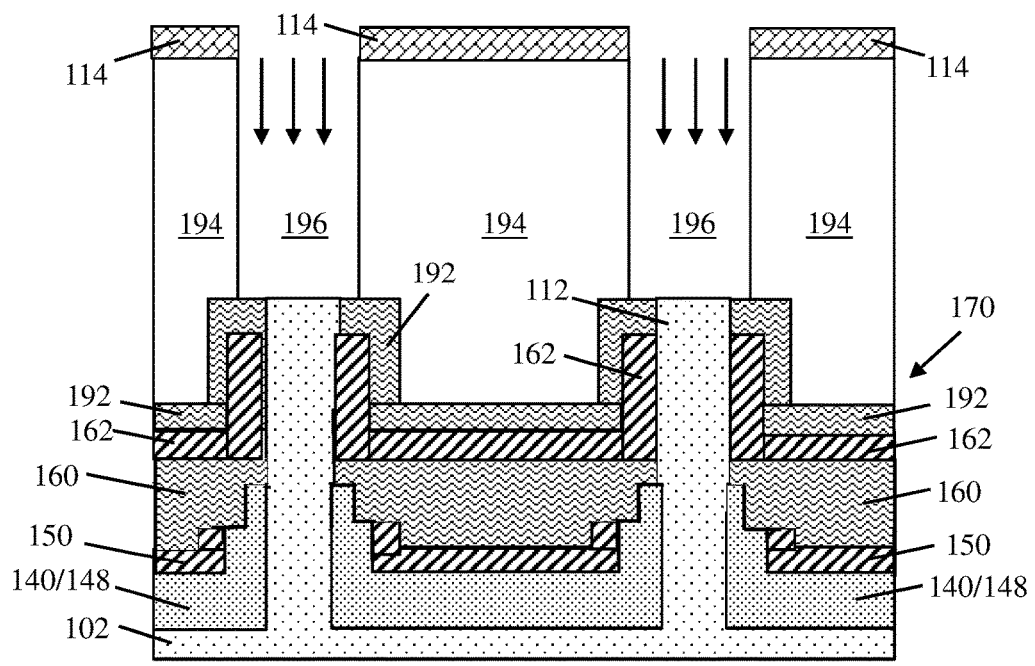
FIG. 16 provides a cross-sectional view of removing a mask from semiconductor fins according to embodiments of the disclosure.

Referring now to FIG. 16, additional processes of forming one or more vertical transistors from IC structure 190 are shown. It is understood that the various processes discussed herein can similarly be implemented relative to IC structure 180 (FIG. 9) and/or IC structure 190B (FIG. 15). Thus, stepped epitaxial regions 140, 148 processed according to the disclosure are simultaneously identified with reference numbers 140 and 148. To electrically separate gate region 162 from overlying structures, an additional spacer 192 can be formed on gate region 162. Additional spacer 192 can include any currently-known or later developed insulating material, e.g., the same material composition as spacer 160. Additional spacer 192 can initially be formed by depositing a bulk spacer material over fin(s) 112 and gate region 162. Mask 114 and some of the deposited spacer material can then be etched back to form additional spacer 192, and to expose an upper surface of fin 112.

After forming additional spacer 192, methods according to the disclosure can include forming an insulator layer 194 over fin(s) 112 and additional spacer 192. Insulator layer 194 can include any electrically insulating material, e.g., one or more dielectric layers, such as those used for inter-level dielectric (ILD) layers in an IC structure. Portions of insulator layer 194 can then be removed, e.g., by etching insulator layer 194 above fin 112, to form a gate conductor 195 and/or source/drain recesses 196 over fins 112. As described elsewhere herein, e.g., relative to FIG. 10, gate conductor 195 can electrically connect gate structure 170 to other components of a device, and may be formed directly, adjacent to, and/or otherwise in contact with gate region 162 of gate structure 170. Thus, gate conductor 195 is shown in phantom to indicate that it may be positioned into or out of the plane of the page with respect to other components shown in FIG. 16. The etching of insulator layer 194 to form recesses 196 is depicted in FIG. 15 with downward-oriented arrows. The size and position of each source/drain recess 196 can be controlled by forming masks 114 on upper surfaces of insulator layer 194 before forming recesses 196.

Figure 17:
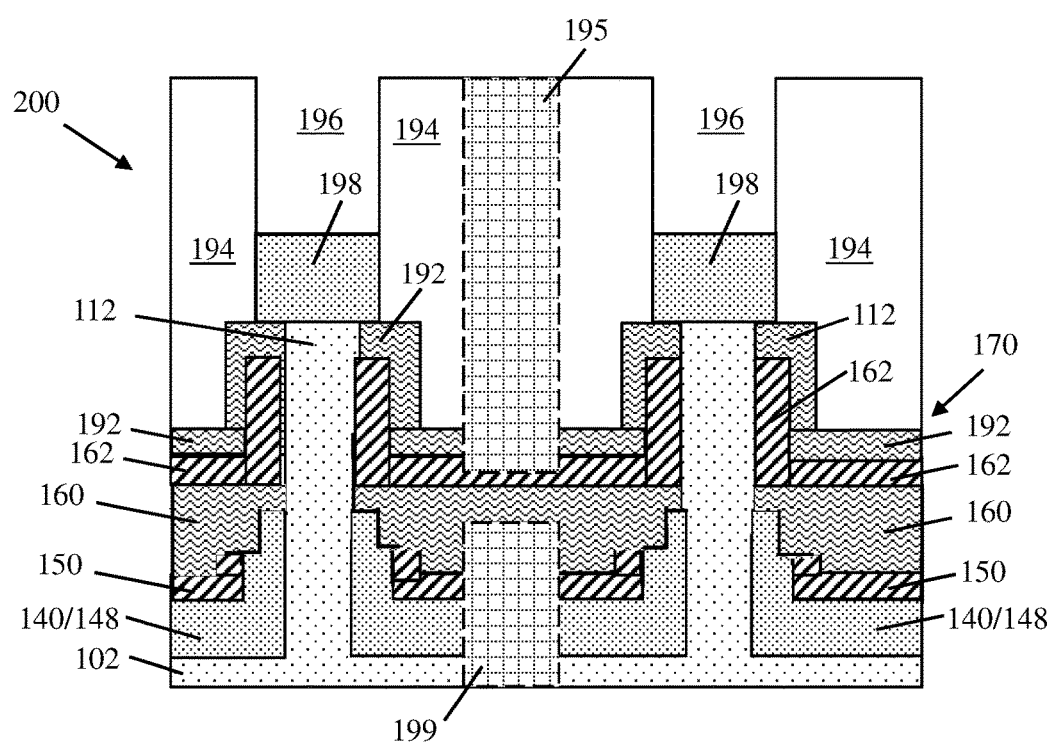
FIG. 17 provides a cross-sectional view of forming an epitaxial layer on semiconductor fins according to embodiments of the disclosure.

Turning to FIG. 17, a source/drain region 198 can be formed on each fin 112 within each recess. As described elsewhere herein relative to source/drain regions 172 (FIG. 9), source/drain regions 198 can be formed by epitaxial growth of new semiconductor material on exposed surfaces of fin 112. After being formed, source/drain regions 198 can at least partially fill recess 196 to create an electrical contact between fin(s) 112 and other electrical components, e.g., conductive metals formed within recesses 196. Processes according to the disclosure can also include forming a source/drain contact 199 to stepped epitaxial region 140, 148. As shown, source/drain contact 199 can be positioned laterally adjacent to stepped epitaxial region 140, 148 or silicide contact 150 at a location into or out of the plane of the page. More specifically, source/drain contact 199 can laterally abut stepped epitaxial region 140, 148 and/or silicide contact 150 to provide an electrical connection to a source or drain terminal of vertical transistor 200.

The various components described herein can provide a vertical transistor 200. Contact 199 of vertical transistor 200 is shown in phantom in FIG. 16 to illustrate that contact 199 may be located laterally inwardly or outwardly from remaining portions of vertical transistor 200, e.g., into or out of the plane of the page. In other cases, contact 199 can be formed by removing portions of substrate 102, stepped epitaxial region 140, 148, suicide region 150, spacer 160, gate region 162, additional spacer 192, insulator layer 194, etc., where appropriate and forming a conductive contact within the removed portions. In any case, a vertical transistor 200 formed according to the disclosure can include a first source/drain terminal in the form of stepped epitaxial region(s) 140, 148 laterally adjacent to and abutting fin(s) 112. As noted elsewhere herein, stepped epitaxial region(s) 140, 148 can include multiple regions (e.g., regions 142, 144, 146 (FIG. 11)) to yield a varied vertical separation distance between stepped epitaxial region(s) 140, 148 and gate region 162. Source/drain region(s) 198 thus can define the other source/drain terminal of vertical transistor 200. Gate region 162 can laterally abut fin 112 to serve as a gate contact to vertical transistor 200. The non-uniform vertical separation between stepped epitaxial region 140, 148 and gate region 162 can reduce the parasitic capacitance of vertical transistor 200 during operation while providing increased electrical conductivity between stepped epitaxial region(s) 140, 148 and fin(s) 112.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit (IC) structure, the method comprising:
    removing a portion of a substrate to form a recess therein, the portion of the substrate being laterally adjacent to a semiconductor fin having a sidewall spacer thereon, wherein the removing undercuts the sidewall spacer to expose an underlying sidewall of the semiconductor fin;
    forming an epitaxial layer within the recess, such that the epitaxial layer laterally abuts the sidewall of the semiconductor fin below the sidewall spacer;
    removing a portion of the epitaxial layer to form a stepped epitaxial region adjacent to the semiconductor fin, the stepped epitaxial region including a first region laterally abutting the sidewall of the semiconductor fin, and a second region laterally adjacent to the first region, wherein a height of the first region over the substrate is greater than a height of the second region over the substrate; and
    forming a gate structure over the stepped epitaxial region and adjacent to the semiconductor fin.

2. The method of claim 1, further comprising forming a silicide region on at least an upper surface of the second region of the stepped epitaxial region and a sidewall of the first region of the stepped epitaxial region before forming the gate structure over the stepped epitaxial region.

3. The method of claim 1, wherein forming the gate structure over the stepped epitaxial region includes:
    removing the sidewall spacer from the semiconductor fin;
    forming a spacer over the stepped epitaxial region such that the spacer laterally contacts the sidewall of the semiconductor fin; and
    forming a gate region on the spacer such that the gate region laterally contacts the sidewall of the semiconductor fin.

4. The method of claim 1, further comprising:
    forming an additional epitaxial region on an upper surface of the semiconductor fin, wherein the stepped epitaxial region and the additional epitaxial region each define a source/drain region of a vertical transistor, and wherein the gate structure defines a gate of the vertical transistor.

5. The method of claim 1, further comprising, after forming the epitaxial layer within the recess:
    removing the sidewall spacer from the semiconductor fin; and
    forming an insulative liner on the semiconductor fin and over the epitaxial layer, wherein a thickness of the insulative liner is different from a thickness of the removed sidewall spacer.

6. The method of claim 5, wherein a thickness of the second region of the stepped epitaxial region is approximately equal to the thickness of the insulative liner.

7. The method of claim 5, further comprising removing the insulative liner from the semiconductor fin before forming the gate structure over the stepped epitaxial region.

8. A method of forming an integrated circuit (IC) structure, the method comprising:
    removing a portion of a substrate to form a recess therein, the portion of the substrate being laterally adjacent to a semiconductor fin having a sidewall spacer thereon, wherein the removing undercuts the sidewall spacer to expose an underlying sidewall of the semiconductor fin;
    forming an epitaxial layer within the recess, such that the epitaxial layer laterally abuts the sidewall of the semiconductor fin below the sidewall spacer;
    removing the sidewall spacer from the semiconductor fin;
    forming a first insulative liner on the semiconductor fin and over the epitaxial layer;
    removing a portion of the epitaxial layer to form a first region of the epitaxial layer laterally abutting the sidewall of the semiconductor fin, and a second region of the epitaxial layer laterally adjacent to the first region, wherein a height of the first region over the substrate is greater than a height of the second region over the substrate;

forming a second insulative liner on the semiconductor fin to overlie a portion of the second region of the epitaxial layer;

removing an additional portion of the epitaxial layer to form a third region of the epitaxial layer laterally adjacent to the second region, wherein a height of the third region over the substrate is less than the height of the second region over the substrate, and wherein the first, second, and third regions define a stepped epitaxial region;

removing the first and second insulative liners; and forming a gate structure over the stepped epitaxial region and adjacent to the semiconductor fin.

9. The method of claim 8, further comprising forming a silicide region on at least an upper surface of the third region of the stepped epitaxial region and a sidewall of the second region of the stepped epitaxial region before forming the gate structure over the stepped epitaxial region.

10. The method of claim 8, wherein forming the gate structure over the stepped epitaxial region includes:

forming a spacer over the stepped epitaxial region such that the spacer laterally contacts the sidewall of the semiconductor fin; and forming a gate region on the spacer such that the gate region laterally contacts the sidewall of the semiconductor fin.

11. The method of claim 8, further comprising:

forming an additional epitaxial region on an upper surface of the semiconductor fin, wherein the stepped epitaxial region and the additional epitaxial region each define a source/drain region of a vertical transistor, and wherein the gate structure defines a gate of the vertical transistor.

12. The method of claim 10, further comprising:

forming a mask on the upper surface of the semiconductor fin before removing the portion of the substrate; and removing the mask from the upper surface of the semiconductor fin before forming the additional epitaxial region thereon.

13. The method of claim 8, wherein the stepped epitaxial region is positioned directly laterally between the semiconductor fin and an adjacent semiconductor fin positioned on the substrate.

14. The method of claim 13, wherein the stepped epitaxial region is substantially U-shaped.

* * * * *